(12) United States Patent
Bertness et al.

(10) Patent No.: US 6,906,523 B2
(45) Date of Patent: *Jun. 14, 2005

(54) METHOD AND APPARATUS FOR TESTING CELLS AND BATTERIES EMBEDDED IN SERIES/PARALLEL SYSTEMS

(75) Inventors: Kevin I. Bertness, Batavia, IL (US); Keith S. Champlin, Minneapolis, MN (US)

(73) Assignee: Midtronics, Inc., Willowbrook, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 239 days.

(21) Appl. No.: 10/119,297

(22) Filed: Apr. 9, 2002

(65) Prior Publication Data

US 2002/0180445 A1 Dec. 5, 2002

Related U.S. Application Data

(63) Continuation-in-part of application No. 09/862,783, filed on May 21, 2001, now abandoned, which is a continuation-in-part of application No. 09/662,092, filed on Sep. 14, 2000, now abandoned.

(51) Int. Cl.[7] .......................................... G01N 27/416
(52) U.S. Cl. ....................................................... 324/426
(58) Field of Search ................................. 324/426, 430

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |

(Continued)

FOREIGN PATENT DOCUMENTS

| | | |
|---|---|---|
| GB | 2 246 916 A | 10/1990 |
| JP | 11103503 A | 4/1999 |
| WO | WO 01/59443 | 2/2001 |

OTHER PUBLICATIONS

"Notification of Transmittal of The International Search Report or the Declaration", PCT/US03/07837.
"Notification of Transmittal of The International Search Report or the Declaration", PCT/US03/41561.
"Notification of Transmittal of The International Search Report or the Declaration", PCT/US03/27696.
"Electrochemical Impedance Spectroscopy in Battery Development and Testing", *Batteries International*, Apr. 1997, pp. 59 and 62–63.
Sep. 1959, pp. 922–925.

*Primary Examiner*—Pia Tibbits
(74) *Attorney, Agent, or Firm*—Westman, Champlin & Kelly P.A.

(57) ABSTRACT

A "three-point" measurement technique effectively removes system effects to determine impedance, admittance, resistance, or conductance of an individual cell, battery, or interconnecting conductor embedded in a series or series-parallel electrochemical battery or fuel cell system. Three electrical contact points are defined. Two of these points bound the subject element. The third point is separated from the other two by a conducting path that may include one or more cells or batteries. By measuring dynamic parameters between alternate pairs of contact points, three dynamic parameter measurements are acquired. A mathematical computation combines the measurements and determines the dynamic parameter of a subject element as if it were alone—thus effectively "de-embedding" the subject element from the remainder of the system. A "four-point" extension of this technique permits measuring a dynamic parameter of a cell/battery disposed in a multiple-unit string of parallel-connected cells/batteries.

70 Claims, 6 Drawing Sheets

U.S. PATENT DOCUMENTS

| | | |
|---|---|---|
| 3,562,634 A | 2/1971 | Latner .................. 324/427 |
| 3,593,099 A | 7/1971 | Scholl .................. 320/127 |
| 3,607,673 A | 9/1971 | Seyl .................... 324/425 |
| 3,652,341 A | 3/1972 | Halsall et al. ........... 29/623.2 |
| 3,676,770 A | 7/1972 | Sharaf et al. ............ 324/430 |
| 3,729,989 A | 5/1973 | Little ................ 73/862.192 |
| 3,750,011 A | 7/1973 | Kreps .................. 324/430 |
| 3,753,094 A | 8/1973 | Furuishi et al. .......... 324/430 |
| 3,796,124 A | 3/1974 | Crosa .................. 411/521 |
| 3,808,522 A | 4/1974 | Sharaf .................. 324/730 |
| 3,811,089 A | 5/1974 | Strezelewicz ............ 324/170 |
| 3,873,911 A | 3/1975 | Champlin ............... 324/430 |
| 3,876,931 A | 4/1975 | Godshalk ............... 324/429 |
| 3,886,443 A | 5/1975 | Miyakawa et al. ......... 324/426 |
| 3,889,248 A | 6/1975 | Ritter .................. 340/636 |
| 3,906,329 A | 9/1975 | Bader .................. 320/134 |
| 3,909,708 A | 9/1975 | Champlin ............... 324/431 |
| 3,936,744 A | 2/1976 | Perlmutter .............. 324/272 |
| 3,946,299 A | 3/1976 | Christianson et al. ....... 324/430 |
| 3,947,757 A | 3/1976 | Grube et al. ............. 324/416 |
| 3,969,667 A | 7/1976 | McWilliams ............. 324/427 |
| 3,979,664 A | 9/1976 | Harris .................. 324/397 |
| 3,984,762 A | 10/1976 | Dowgiallo, Jr. .......... 324/420 |
| 3,984,768 A | 10/1976 | Staples ................. 324/712 |
| 3,989,544 A | 11/1976 | Santo ................... 429/65 |
| 4,008,619 A | 2/1977 | Alcaide et al. ............ 73/124 |
| 4,023,882 A | 5/1977 | Pettersson .............. 439/426 |
| 4,024,953 A | 5/1977 | Nailor, III .............. 206/344 |
| 4,047,091 A | 9/1977 | Hutchines et al. .......... 363/60 |
| 4,053,824 A | 10/1977 | Dupuis et al. ............ 324/434 |
| 4,056,764 A | 11/1977 | Endo et al. .............. 320/101 |
| 4,070,624 A | 1/1978 | Taylor .................. 327/772 |
| 4,086,531 A | 4/1978 | Bernier ................. 324/772 |
| 4,112,351 A | 9/1978 | Back et al. .............. 324/380 |
| 4,114,083 A | 9/1978 | Benham et al. ........... 320/150 |
| 4,126,874 A | 11/1978 | Suzuki et al. ............ 396/301 |
| 4,160,916 A | 7/1979 | Papsideris .............. 307/10.6 |
| 4,178,546 A | 12/1979 | Hulls et al. ............. 324/772 |
| 4,193,025 A | 3/1980 | Frailing et al. ........... 324/427 |
| 4,207,611 A | 6/1980 | Gordon ................. 324/503 |
| 4,217,645 A | 8/1980 | Barry et al. ............. 702/63 |
| 4,280,457 A | 7/1981 | Bloxham ............... 123/198 R |
| 4,297,639 A | 10/1981 | Branham ................ 324/429 |
| 4,315,204 A | 2/1982 | Sievers et al. ............ 322/28 |
| 4,316,185 A | 2/1982 | Watrous et al. ........... 320/116 |
| 4,322,685 A | 3/1982 | Frailing et al. ........... 324/429 |
| 4,351,405 A | 9/1982 | Fields et al. ............ 180/65.8 |
| 4,361,809 A | 11/1982 | Bil et al. ................ 324/426 |
| 4,363,407 A | 12/1982 | Barkler et al. ............ 209/3.3 |
| 4,369,407 A | 1/1983 | Korbell ................. 324/416 |
| 4,379,989 A | 4/1983 | Kurz et al. .............. 320/165 |
| 4,379,990 A | 4/1983 | Sievers et al. ............ 322/99 |
| 4,390,828 A | 6/1983 | Converse et al. .......... 320/153 |
| 4,392,101 A | 7/1983 | Saar et al. .............. 320/156 |
| 4,396,880 A | 8/1983 | Windebank .............. 320/156 |
| 4,408,157 A | 10/1983 | Beaubien ............... 324/712 |
| 4,412,169 A | 10/1983 | Dell'Orto ............... 320/123 |
| 4,423,378 A | 12/1983 | Marino et al. ............ 324/427 |
| 4,423,379 A | 12/1983 | Jacobs et al. ............ 324/429 |
| 4,424,491 A | 1/1984 | Bobbett et al. ........... 324/433 |
| 4,459,548 A | 7/1984 | Lentz et al. ............. 324/772 |
| 4,514,694 A | 4/1985 | Finger .................. 324/429 |
| 4,520,353 A | 5/1985 | McAuliffe ............... 340/636 |
| 4,620,767 A | 11/1986 | Woolf ................... 439/217 |
| 4,633,418 A | 12/1986 | Bishop .................. 702/63 |
| 4,659,977 A | 4/1987 | Kissel et al. ............. 320/150 |
| 4,663,580 A | 5/1987 | Wortman ................ 320/153 |
| 4,665,370 A | 5/1987 | Holland ................. 324/429 |
| 4,667,143 A | 5/1987 | Cooper et al. ............ 320/153 |
| 4,667,279 A | 5/1987 | Maier ................... 363/46 |
| 4,678,998 A | 7/1987 | Muramatsu .............. 324/427 |
| 4,679,000 A | 7/1987 | Clark ................... 324/428 |
| 4,680,528 A | 7/1987 | Mikami et al. ........... 320/165 |
| 4,697,134 A | 9/1987 | Burkum et al. ........... 320/134 |
| 4,707,795 A | 11/1987 | Alber et al. .............. 702/63 |
| 4,709,202 A | 11/1987 | Koenck et al. ........... 320/112 |
| 4,710,861 A | 12/1987 | Kanner .................. 363/46 |
| 4,719,428 A | 1/1988 | Liebermann .............. 324/436 |
| 4,743,855 A | 5/1988 | Randin et al. ............ 324/430 |
| 4,745,349 A | 5/1988 | Palanisamy et al. ........ 320/125 |
| 4,816,768 A | 3/1989 | Champlin ............... 324/438 |
| 4,820,966 A | 4/1989 | Fridman ................ 320/116 |
| 4,825,170 A | 4/1989 | Champlin ............... 324/436 |
| 4,847,547 A | 7/1989 | Eng, Jr. ................. 320/153 |
| 4,849,700 A | 7/1989 | Morioka et al. ........... 324/427 |
| 4,876,495 A | 10/1989 | Palanisamy et al. ........ 320/106 |
| 4,881,038 A | 11/1989 | Champlin ............... 324/426 |
| 4,912,416 A | 3/1990 | Champlin ............... 324/430 |
| 4,913,116 A | 4/1990 | Katogi et al. .......... 123/406.32 |
| 4,929,931 A | 5/1990 | McCuen ................. 340/636 |
| 4,931,738 A | 6/1990 | MacIntyre et al. ......... 324/435 |
| 4,933,845 A | 6/1990 | Hayes ................... 710/104 |
| 4,934,957 A | 6/1990 | Bellusci ................. 439/504 |
| 4,937,528 A | 6/1990 | Palanisamy .............. 324/430 |
| 4,947,124 A | 8/1990 | Hauser .................. 324/430 |
| 4,949,046 A | 8/1990 | Seyfang ................. 324/427 |
| 4,956,597 A | 9/1990 | Heavey et al. ............ 320/129 |
| 4,968,941 A | 11/1990 | Rogers .................. 324/428 |
| 4,968,942 A | 11/1990 | Palanisamy .............. 324/430 |
| 5,004,979 A | 4/1991 | Marino et al. ............ 324/160 |
| 5,032,825 A | 7/1991 | Kuznicki ................ 340/636 |
| 5,037,778 A | 8/1991 | Stark et al. .............. 228/121 |
| 5,047,722 A | 9/1991 | Wurst et al. ............. 324/430 |
| 5,087,881 A | 2/1992 | Peacock ................. 324/378 |
| 5,095,223 A | 3/1992 | Thomas ................. 307/110 |
| 5,108,320 A | 4/1992 | Kimber .................. 439/863 |
| 5,126,675 A | 6/1992 | Yang .................... 324/635 |
| 5,140,269 A | 8/1992 | Champlin ............... 324/433 |
| 5,144,219 A | 9/1992 | Conzelmann et al. ....... 320/139 |
| 5,144,248 A | 9/1992 | Alexandres et al. ........ 324/428 |
| 5,159,272 A | 10/1992 | Rao et al. ............... 324/429 |
| 5,160,881 A | 11/1992 | Schramm et al. .......... 322/7 |
| 5,170,124 A | 12/1992 | Blair et al. .............. 324/434 |
| 5,179,335 A | 1/1993 | Nor ..................... 320/159 |
| 5,194,799 A | 3/1993 | Tomantschger ........... 320/103 |
| 5,204,611 A | 4/1993 | Nor et al. ............... 320/145 |
| 5,214,370 A | 5/1993 | Harm et al. ............. 320/152 |
| 5,214,385 A | 5/1993 | Gabriel et al. ............ 324/434 |
| 5,241,275 A | 8/1993 | Fang .................... 324/430 |
| 5,254,952 A | 10/1993 | Salley et al. ............. 324/429 |
| 5,266,880 A | 11/1993 | Newland ................ 320/125 |
| 5,281,919 A | 1/1994 | Palanisamy .............. 324/427 |
| 5,281,920 A | 1/1994 | Wurst ................... 324/430 |
| 5,295,078 A | 3/1994 | Stich et al. .............. 320/136 |
| 5,298,797 A | 3/1994 | Redl .................... 327/387 |
| 5,300,874 A | 4/1994 | Shimamoto et al. ........ 320/106 |
| 5,302,902 A | 4/1994 | Groehl .................. 324/434 |
| 5,313,152 A | 5/1994 | Wozniak et al. ........... 320/118 |
| 5,315,287 A | 5/1994 | Sol ..................... 340/455 |
| 5,321,626 A | 6/1994 | Palladino ................ 702/63 |
| 5,321,627 A | 6/1994 | Reher ................... 364/483 |
| 5,323,337 A | 6/1994 | Wilson et al. ............ 702/73 |
| 5,325,041 A | 6/1994 | Briggs .................. 320/149 |
| 5,331,268 A | 7/1994 | Patino et al. ............. 320/158 |
| 5,336,993 A | 8/1994 | Thomas et al. ........... 324/158.1 |
| 5,338,515 A | 8/1994 | Dalla Betta et al. ......... 422/95 |
| 5,339,018 A | 8/1994 | Brokaw ................. 320/147 |
| 5,343,380 A | 8/1994 | Champlin ............... 363/46 |
| 5,347,163 A | 9/1994 | Yoshimura .............. 307/66 |
| 5,352,968 A | 10/1994 | Reni et al. .............. 320/136 |
| 5,365,160 A | 11/1994 | Leppo et al. ............. 320/160 |

| Patent No. | Date | Inventor | Class |
|---|---|---|---|
| 5,365,453 A | 11/1994 | Startup et al. | 320/136 |
| 5,381,096 A | 1/1995 | Hirzel | 324/427 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 320/DIG. 21 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/161 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/102 |
| 5,642,031 A | 6/1997 | Brotto | 320/152 |
| 5,650,937 A | 7/1997 | Bounaga | 702/65 |
| 5,652,501 A | 7/1997 | McClure et al. | 320/118 |
| 5,653,659 A | 8/1997 | Kunibe et al. | 477/111 |
| 5,656,920 A | 8/1997 | Cherng et al. | 320/161 |
| 5,675,234 A | 10/1997 | Greene | |
| 5,677,077 A | 10/1997 | Faulk | 429/90 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,808,469 A | 9/1998 | Kopera | 324/434 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/133 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,046,514 A | 4/2000 | Rouillard et al. | 307/77 |
| 6,051,976 A | 4/2000 | Bertness | 324/426 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,222,342 B1 | 4/2001 | Eggert et al. | 320/105 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |

| | | | |
|---|---|---|---|
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,363,303 B1 | 3/2002 | Bertness | 701/29 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,526,361 B1 | 2/2003 | Jones et al. | 702/63 |
| 6,531,848 B1 | 3/2003 | Chitsazan et al. | 320/153 |
| 6,600,815 B1 | 7/2003 | Walding | 379/93.04 |
| 6,618,644 B2 | 9/2003 | Bean | 700/231 |
| 6,628,011 B2 | 9/2003 | Droppo et al. | 307/43 |
| 6,667,624 B1 | 12/2003 | Raichle et al. | 324/522 |
| 6,679,212 B2 | 1/2004 | Kelling | 123/179.28 |
| 2002/0010558 A1 | 1/2002 | Bertness et al. | 702/63 |
| 2002/0176010 A1 | 11/2002 | Wallach et al. | 348/229.1 |
| 2003/0025481 A1 | 2/2003 | Bertness | 320/155 |
| 2003/0184306 A1 | 10/2003 | Bertness et al. | 324/426 |
| 2004/0000891 A1 | 1/2004 | Raichle et al. | 320/107 |

…

METHOD AND APPARATUS FOR TESTING CELLS AND BATTERIES EMBEDDED IN SERIES/PARALLEL SYSTEMS

The present application is a Continuation-In-Part of U.S. patent application Ser. No. 09/862,783, filed May 21, 2001 now abandoned, which is a Continuation-In-Part of U.S. patent application Ser. No. 09/662,092, filed Sep. 14, 2000 now abandoned, the content of which is hereby incorporated by reference in its entirety.

BACKGROUND OF THE INVENTION

The present invention relates to electronically testing electrochemical cells and batteries including fuel cells and batteries. More specifically, it relates to accurately determining a dynamic parameter of a particular element, i.e., cell, battery, or interconnecting conductor, embedded in a cell/battery system as if it were isolated from the system. Such a determination is referred to as "de-embedding" the subject element.

Electrochemical cells and batteries, such as primary cells/batteries, secondary (i.e., storage) cells/batteries, and fuel cells/batteries are important sources of electrical energy. Connecting such units together in series causes their voltages to add. Connecting them together in parallel causes their currents to add. Accordingly, series-connected cells/batteries, parallel-connected cells/batteries, and series/parallel combinations of cells/batteries are routinely found in many applications including automotive, traction, heavy equipment, standby, and telecommunication applications.

Precisely determining a dynamic electrical parameter (i.e., complex impedance, complex admittance, real resistance, or real conductance) of an individual cell/battery or interconnecting conductor embedded in a larger system without disconnecting the subject element from the system has traditionally posed an important challenge. Burkum, et al., in U.S. Pat. No. 4,697,134, described one approach to this challenge. This patent teaches passing a known ac current through the parallel combination of a string of series-connected cells, a battery charger, and a load. It then determines the "impedance" of an individual cell or inter-cell connector by measuring the ac voltage developed across the cell or connector and taking the ratio of this measured ac voltage to the known ac current. However, this procedure determines only the magnitude of the complex impedance. Furthermore, the disclosed technique is subject to significant errors due to current-shunting by the charger and the load. The method of Burkum, et al., also ignores the influence of series strings that are in parallel with the desired string in multi-string installations—an arrangement commonly found in telephone central offices.

Methods and apparatus for measuring complex impedance and complex admittance of electrochemical cells and batteries as well as general electrical elements have recently been disclosed by Champlin in U.S. Pat. Nos. 6,002,238, 6,172,483, 6,262,563, and 6,294,896. However, the techniques disclosed therein apply generally to measuring isolated elements. If the subject element is embedded in a larger battery/electrical system, the loading imposed by the remainder of the system may influence the results of the measurement.

The inventions disclosed herein remove this system influence by mathematically "de-embedding" a subject element, i.e., cell, battery or interconnecting conductor, from the remainder of the battery/electrical system. The disclosed method and apparatus permit accurately determining a dynamic parameter, i.e., impedance, admittance, resistance, or conductance, of an embedded element without actually disconnecting that element from the system.

SUMMARY OF THE INVENTION

The present invention employs a "three-point" measurement technique to determine a dynamic parameter of an individual element (i.e., cell/battery or interconnecting conductor) embedded in a series, or series-parallel, electrochemical cell, battery, or fuel cell system. Three electrical contact points are defined. Two of these points bound the subject cell/battery or interconnecting conductor. The third point is separated from the other two by a conducting path that may include one or more cells or batteries. By measuring dynamic parameters between alternate pairs of contact points, three dynamic parameter measurements are acquired. A mathematical computation combines the measurements and determines the dynamic parameter of a subject element as if it were alone—thus effectively "de-embedding" the subject element from the remainder of the system. A "four-point" extension of this technique permits measuring a dynamic parameter of a cell, battery, or interconnecting conductor disposed in a multiple-unit string of parallel-connected cells or batteries.

DETAILED DESCRIPTION OF THE PREFERRED EMBODIMENTS

Figure 1:
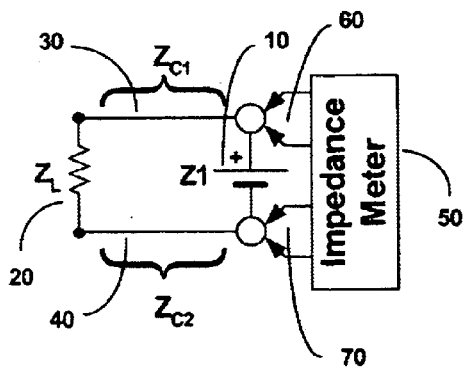
FIG. 1 is a schematic representation depicting the impedance of a cell/battery being measured while the cell/battery is connected to a load.

Consider FIG. 1. This figure illustrates measuring the impedance of a cell/battery 10 embedded in a very simple system comprising cell/battery 10 connected to load 20 through interconnecting conductors 30 and 40. Impedances Z1, $Z_L$, $Z_{C1}$, and $Z_{C2}$ represent the impedances of cell/battery 10, load 20, interconnecting conductor 30, and interconnecting conductor 40, respectively. Impedance meter 50, which may be of the type disclosed by Champlin in the four patents referenced above, couples to the two terminals of cell/battery 10 with Kelvin input probe 60 and Kelvin input probe 70. As is well known, Kelvin probes comprise two separate electrical connections to each contact point—one for current and one for voltage. Their purpose is to negate the effects of contact and lead-wire resistance. Although Kelvin probes are usually required to obtain accurate measurements with the very small impedance values encountered in most battery systems, the "three-point" measurement technique disclosed herein does not rely upon Kelvin probes. Single-conductor connections to each contact point will also suffice if impedance values are sufficiently large.

Figure 2:
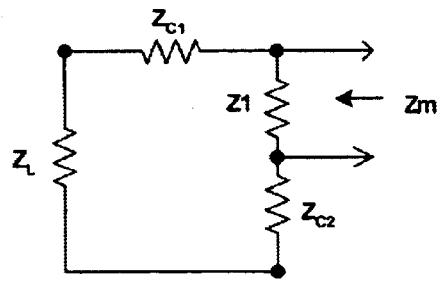
FIG. 2 is a simplified equivalent circuit representing the measurement arrangement of FIG. 1.

FIG. 2 shows an equivalent circuit representation of the simple battery system of FIG. 1. Because the series combination of $Z_L$, $Z_{C1}$, and $Z_{C2}$ is in parallel with impedance Z1, the impedance Zm "seen" by impedance meter 50 is not actually Z1 but is instead the composite impedance:

$$Zm = \frac{Z1 \cdot (Z_{C1} + Z_{C2} + Z_L)}{Z1 + Z_{C1} + Z_{C2} + Z_L} \quad (1)$$

The influence of impedances $Z_{C1}$, $Z_{C2}$, and $Z_L$ upon the measured impedance Zm is clearly observed in equation (1).

Figure 3:
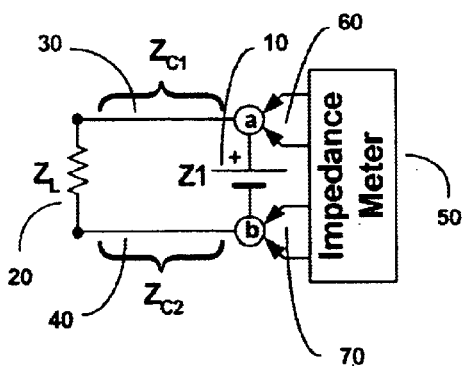
FIG. 3 is a schematic representation of a first impedance measurement of the circuit of FIG. 1 in accordance with a particular aspect of the present invention.
Figure 4:
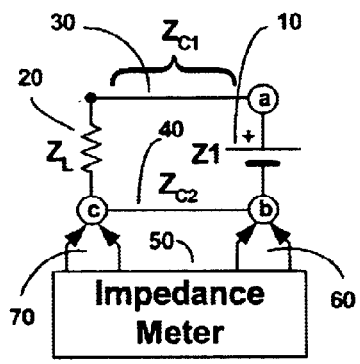
FIG. 4 is a schematic representation of a second impedance measurement of the circuit of FIG. 1 in accordance with a particular aspect of the present invention.
Figure 5:
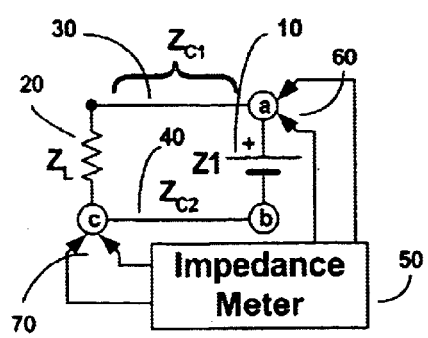
FIG. 5 is a schematic representation of a third impedance measurement of the circuit of FIG. 1 in accordance with a particular aspect of the present invention.

Now consider performing three impedance measurements as shown in FIGS. 3, 4, and 5.

First measure Zab (FIG. 3) with both Kelvin input probes of impedance meter 50 coupled to the two terminals, a and b, of the cell/battery being measured. Terminals a and b effectively "bound" cell/battery impedance Z1 and comprise the first two electrical contact points of a three-point measurement technique.

Next measure Zbc (FIG. 4) with Kelvin probe 60 coupled to terminal b, and Kelvin probe 70 bridging across interconnecting conductor 40 to couple to load 20 at contact point c. Point c comprises the third electrical contact point of the three-point measurement technique.

Finally, measure Zca (FIG. 5) with one Kelvin probe coupled to point c and the other coupled to point a.

Figure 6:
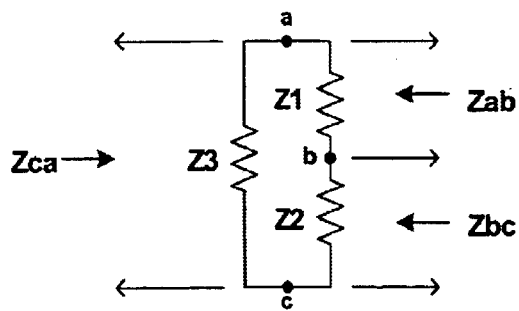
FIG. 6 is a simplified equivalent circuit of the circuit of FIG. 1 illustrating the three impedances measured in the measurements of FIGS. 3, 4, and 5.

FIG. 6 shows an equivalent circuit relating the three measured impedances, Zab, Zbc, and Zca, to the three system impedances Z1, Z2, and Z3. Note that this particular choice of electrical contact point c makes system impedance Z2 equal the interconnecting conductance impedance $Z_{C2}$ while system impedance Z3=$Z_L$+$Z_{C1}$ combines the load impedance with the other interconnecting conductor impedance. The alternative choice of contact point c would make Z2=$Z_{C1}$ and Z3=$Z_L$+$Z_{C2}$.

One can easily show from FIG. 6 that the three measured impedances are given by:

$$Zab = \frac{Z1 \cdot (Z2 + Z3)}{Z1 + Z2 + Z3} \quad (2)$$

$$Zbc = \frac{Z2 \cdot (Z3 + Z1)}{Z1 + Z2 + Z3} \quad (3)$$

and $$Zca = \frac{Z3 \cdot (Z1 + Z2)}{Z1 + Z2 + Z3} \quad (4)$$

These three equations can be inverted mathematically to yield explicit expressions for Z1, Z2, and Z3, in terms of the measured quantities Zab, Zbc, and Zca. The results are $$Z1 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zab - Zbc - Zca)} \quad (5)$$

$$Z2 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zbc - Zca - Zab)} \quad (6)$$

and $$Z3 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zca - Zab - Zbc)} \quad (7)$$

Equation (5) effectively "de-embeds" cell/battery 10 since Z1 would be its measured impedance if it were, in fact, completely disconnected from the system.

Figure 7:
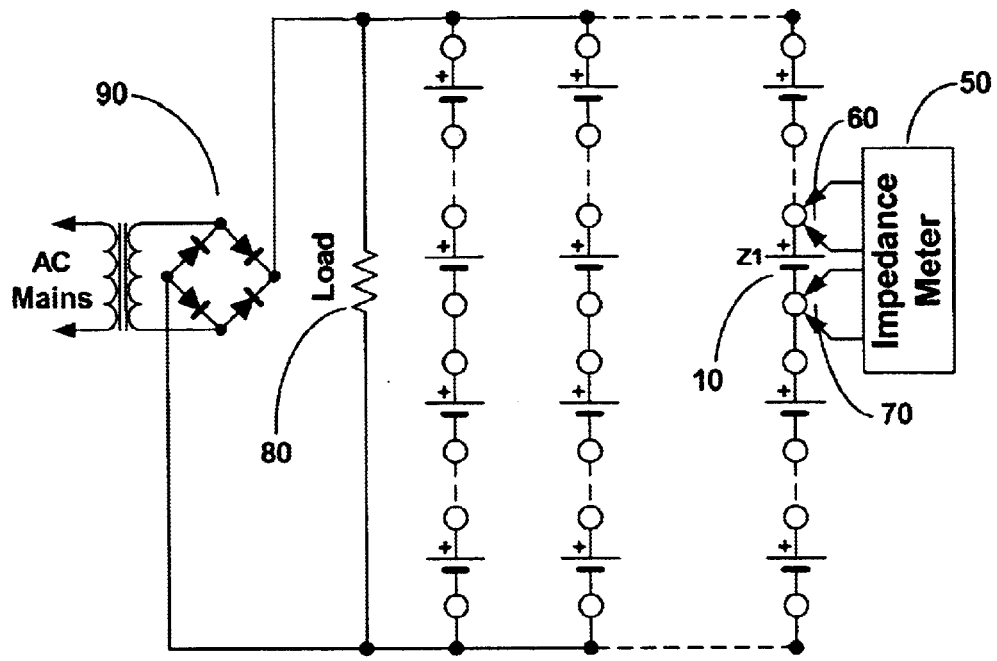
FIG. 7 depicts measuring the impedance of a cell/battery embedded in a series string of such batteries with a plurality of series strings arrayed in parallel.

The three-point measurement technique disclosed above can be readily extended to the very important case depicted in FIG. 7. FIG. 7 illustrates an attempt to measure the impedance Z1 of cell/battery 10 embedded in a series string of cells/batteries, with a plurality of such strings arrayed in parallel. The parallel array may also include a load 80 and a rectifier 90 as shown. This arrangement is typical of battery systems routinely found in telephone central offices. Again, the loading associated with the remainder of the system can hinder accurate measurement of Z1 by impedance meter 50.

Figure 8:
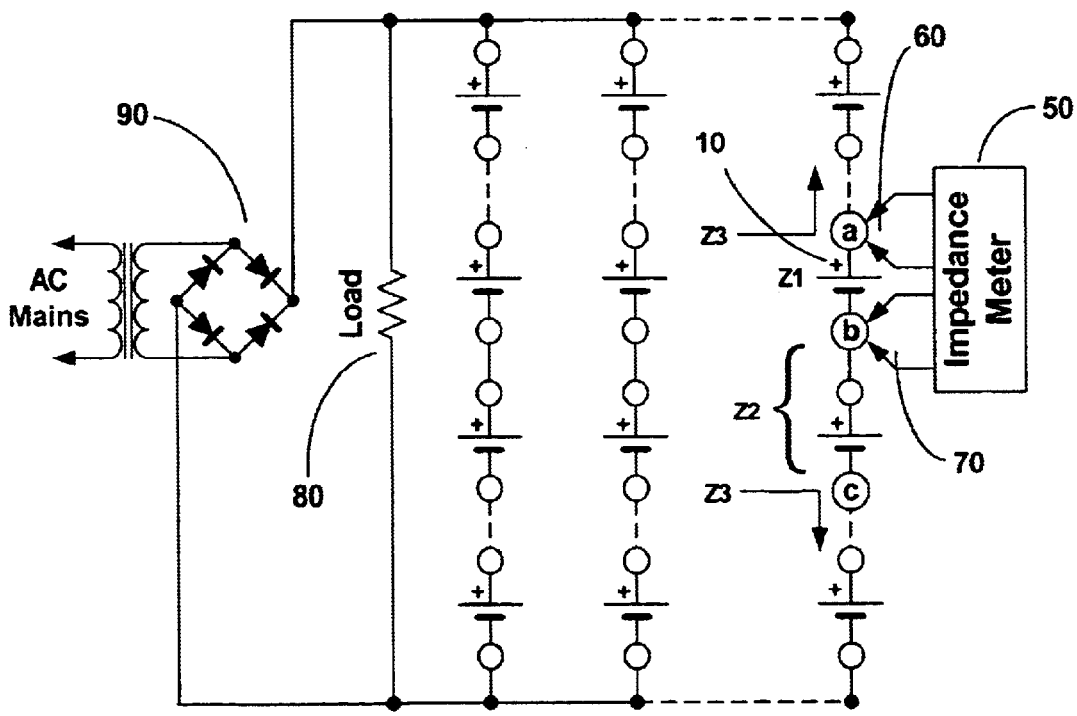
FIG. 8 is a schematic representation of a first impedance measurement of the circuit of FIG. 7 in accordance with a particular aspect of the present invention.
Figure 9:
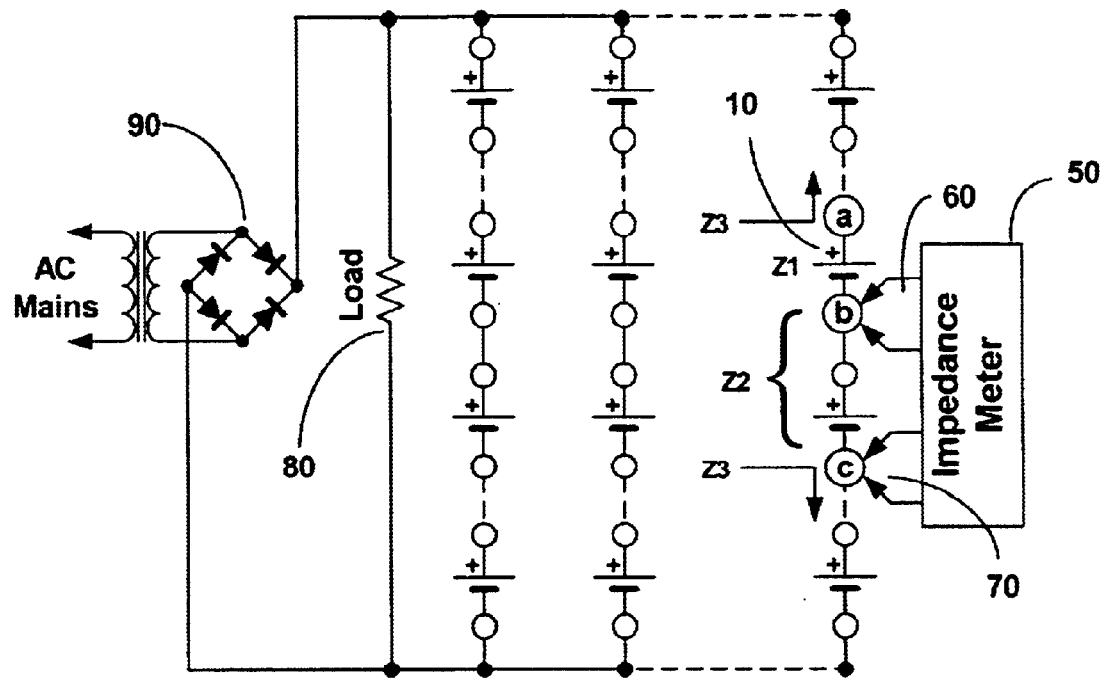
FIG. 9 is a schematic representation of a second impedance measurement of the circuit of FIG. 7 in accordance with a particular aspect of the present invention.
Figure 10:
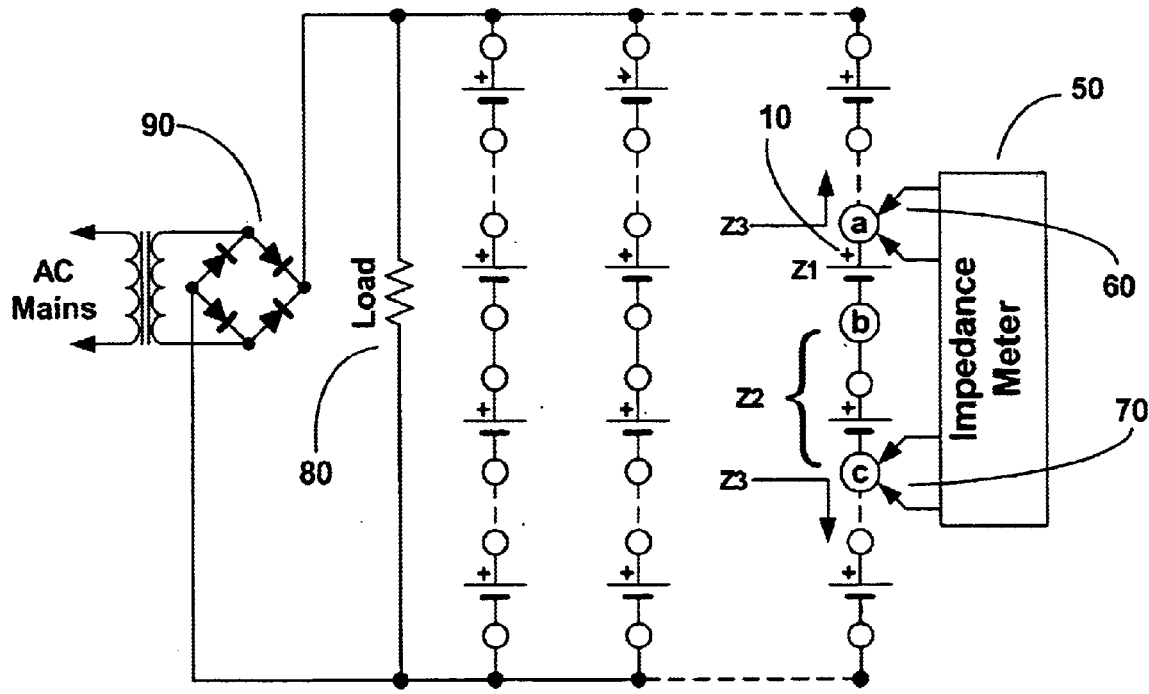
FIG. 10 is a schematic representation of a third impedance measurement of the circuit of FIG. 7 in accordance with a particular aspect of the present invention.

However, consider performing the three impedance measurements shown in FIGS. 8, 9, and 10.

First measure Zab (FIG. 8) with both Kelvin probes of impedance meter 50 coupled to the two terminals, a and b, of the subject cell/battery. These two terminals effectively "bound" the desired impedance Z1 and comprise the first two electrical contact points of the three-point measurement technique.

Next measure Zbc (FIG. 9) with Kelvin probe 60 coupled to contact point b, and Kelvin probe 70 bridging across an adjacent connector and an adjacent cell/battery to couple to contact point c. Point c comprises the third contact point of the three-point measurement technique.

Finally, measure Zca (FIG. 10) with Kelvin probe 70 coupled to point c and Kelvin probe 60 coupled to point a.

The experimental arrangements depicted in FIGS. 8, 9, and 10 have again divided the system into three impedances, Z1, Z2, and Z3. These three system impedances are identified in FIGS. 8, 9, and 10. System impedance Z1 is again the desired impedance of cell/battery 10. System impedance Z2 is an arbitrarily-defined adjacent impedance which includes the impedance of both an adjacent cell/battery and an interconnecting conductor; and system impedance Z3 is the impedance of all of the rest of the battery system—not including system impedances Z1 and Z2.

The equivalent circuit of FIG. 6 again describes the relationships between system impedances Z1, Z2, Z3 and measured impedances Zab, Zbc, and Zca. Accordingly, equations (5)–(7) again explicitly yield Z1, Z2, and Z3. Impedance Z1 represents the "de-embedded" subject cell/battery and is of particular interest. The value of Z1 is again given by equation (5):

$$Z1 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zab - Zbc - Zca)} \quad (5)$$

In the example depicted above, the particular choice of contact point c places both a cell/battery and an interconnecting conductor into impedance Z2. The measured value of Z2 is thus an arbitrary quantity that may be of little interest. However, one could just as well have chosen point c so that impedance Z2 contains only the impedance of the adjacent interconnecting conductor. In that case, impedance Z2 could be of considerable interest. Its value would be explicitly given by equation (6):

$$Z2 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zbc - Zca - Zab)} \quad (6)$$

Impedance Z3 describes the impedance of all of the rest of the battery system—not including impedances Z1 and Z2. Its value is explicitly given by equation (7):

$$Z3 = \frac{(Zab^2 + Zbc^2 + Zca^2 - 2 \cdot Zbc \cdot Zca - 2 \cdot Zca \cdot Zab - 2 \cdot Zab \cdot Zbc)}{2 \cdot (Zca - Zab - Zbc)} \quad (7)$$

In principle, the three measurements could be performed in sequence using conventional impedance measuring circuitry such as the circuitry disclosed by Champlin in the U.S. patents referenced above. The complete measuring apparatus could comprise such circuitry along with a pencil and pad to record the readings and an external hand calculator or computer to evaluate the appropriate equation or equations that "de-embed" the subject element or elements. Alternatively, the apparatus could contain onboard memory circuitry to store the measurements and onboard computation circuitry to perform the "de-embedding" calculations after the required measurements have been made.

Figure 11:
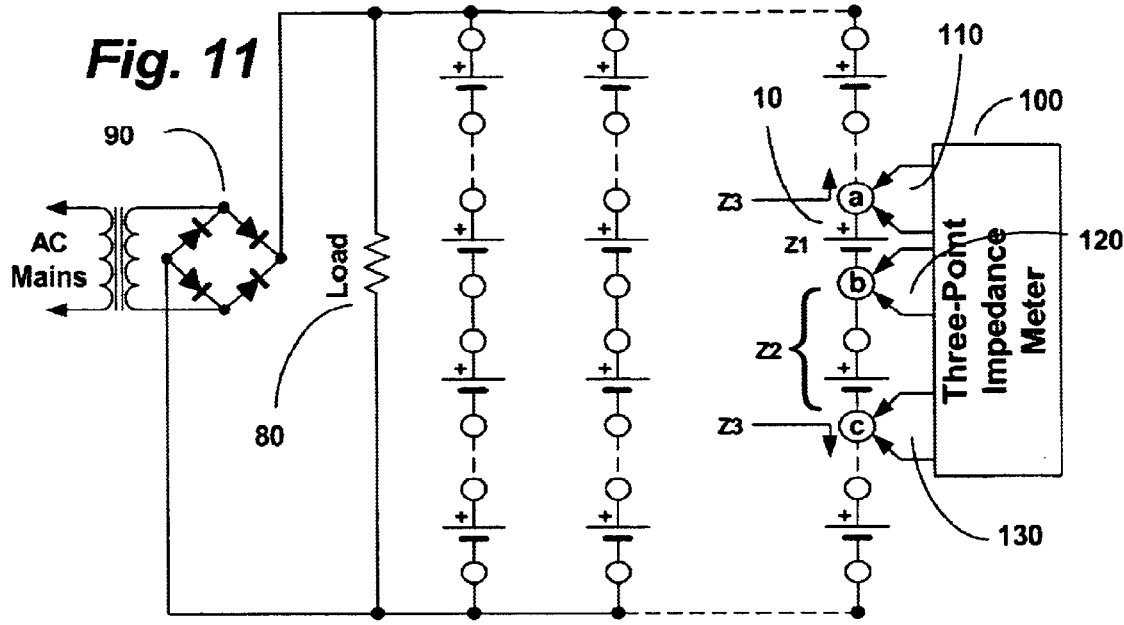
FIG. 11 depicts measuring the impedance of a cell/battery and/or interconnecting conductor embedded in the system of FIG. 7 using a special "three-point" impedance meter in accordance with a particular aspect of the present invention.
Figure 12:
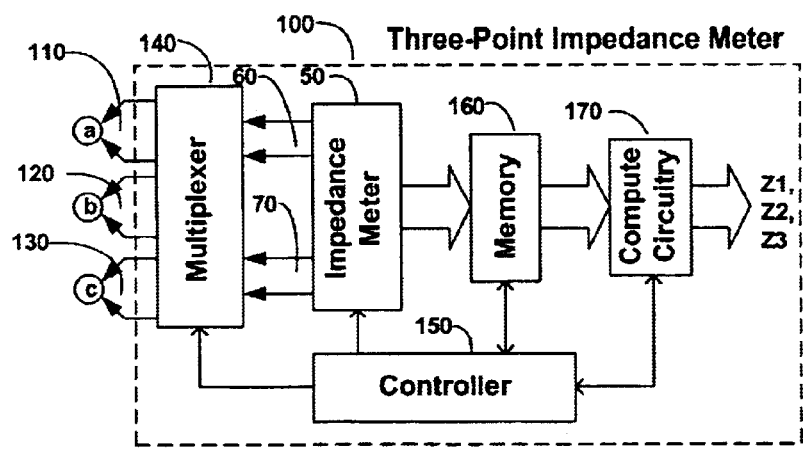
FIG. 12 is a block diagram representation of the special "three-point" impedance meter depicted in FIG. 11.

In addition, one could employ a special three-point impedance meter 100 connected as shown in FIG. 11. One sees in FIG. 11 that three-point impedance meter 100 possesses three sets of system-contacting Kelvin probes 110, 120, and 130 which simultaneously couple to electrical contact points a, b, and c, respectively. FIG. 12 discloses further that three-point impedance meter 100 contains a conventional two-point impedance meter 50 adapted to measure the impedance of an isolated element coupled between its Kelvin input probes 60 and 70. Switching or multiplexing circuitry 140 is interposed between input probes 60, 70 and system-contacting probes 110, 120, 130, and is adapted to selectively couple a pair of system-contacting probes (either 110 & 120, 120 & 130, or 130 & 110) to input probes 60 & 70.

Under programmed control of microprocessor/controller 150, switching/multiplexing circuitry 140 alternately couples each pair of system-contacting probes to input probes 60 and 70, and impedance meter 50 measures the impedance between its input probes 60 and 70. The resulting three measured impedances are temporarily stored in storage memory 160 and then processed by computation circuitry 170—which may, in fact, also comprise microprocessor/controller 150—to determine the subject embedded impedance or impedances using one or more of equations (5), (6), and (7). Three-point impedance meter 100 therefore "de-embeds" the subject impedances directly, without operator intervention.

One could also construct measuring apparatus 180 (FIG. 13) which is similar to three-point impedance meter 100, but is extended to have an arbitrary number n of system-contacting probes—where n is any integer between 3 and the number of interconnection points in the system. Under programmed control of microprocessor/controller 150, switching/multiplexing circuitry 140 alternately selects appropriate system-contacting probes in groups of three. By consecutively performing three-point measurements upon each selected group, and evaluating one or more of equations (5), (6) and (7) after each set of three impedance measurements, extended apparatus 180 can potentially "de-embed" every element in the entire system without operator intervention.

Figure 13:
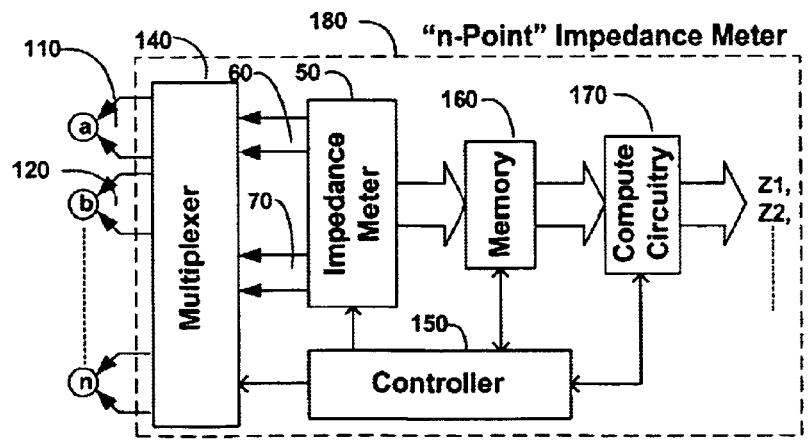
FIG. 13 is a block diagram representation of a special "n-point" impedance meter in accordance with a particular aspect of the present invention.
Figure 14:
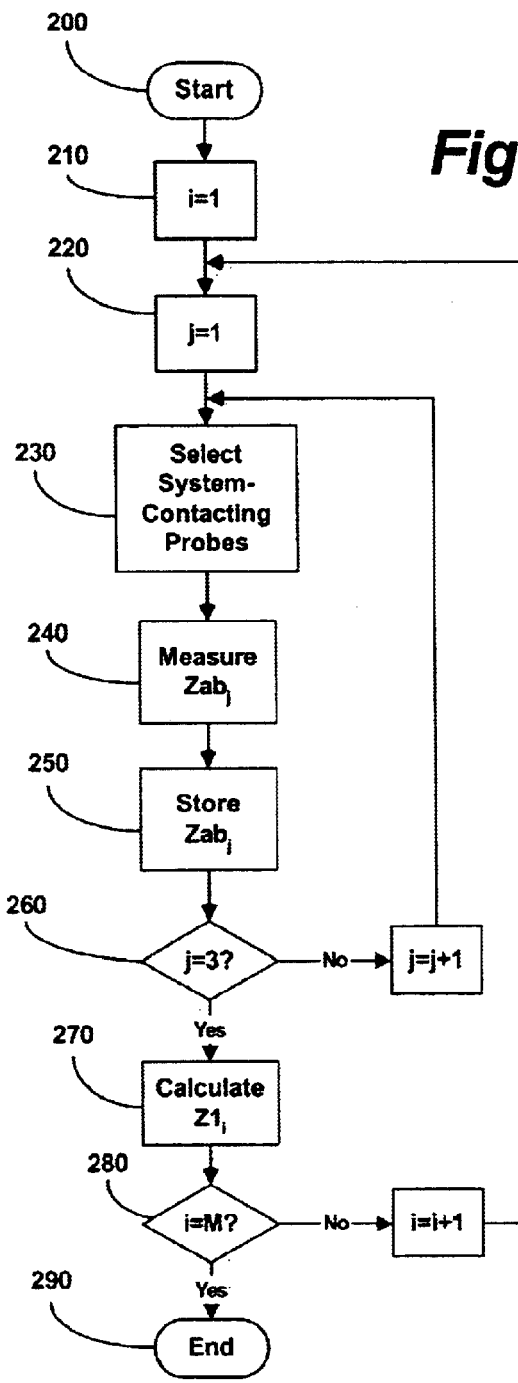
FIG. 14 is a flow chart of a control algorithm for "de-embedding" M single elements using the apparatus of FIG. 13.

FIG. 14 discloses a flowchart of a control algorithm for "de-embedding" M single elements using the apparatus of FIG. 13. The algorithm begins at step 200. Step 210 initializes a measurement counter i, and step 220 initializes an element counter j. At step 230, a particular pair of system-contacting probes is selected by switching/multiplexing circuitry 140. The corresponding impedance between these probes is measured at step 240 and stored in memory 160 at step 250. At step 260, the measurement counter is tested. If it has not reached 3, the measurement counter is incremented and the measurements are repeated with a different pair of system-contacting probes. If the measurement counter has reached 3, computation circuitry 170 calculates the impedance of one embedded element from the three measured impedances stored in memory 160 at step 270. The element counter is then tested at step 280. If it has not reached M, the element counter is incremented and the procedure is repeated to "de-embed" another element. However, if the element counter has reached M, all M elements have been "de-embedded", and the procedure terminates at step 290.

One sees from the discussion regarding FIGS. 8, 9, and 10 that electrical contact point c can be chosen rather arbitrarily if one is only interested in the impedance of a single element, Z1. This single element could be either a cell/battery or an interconnecting conductor. If one desires to additionally measure the impedance of the nearest adjacent element (interconnecting conductor or cell/battery), the interval between b and c (i.e., impedance Z2) must contain only that one adjacent element.

Figure 15:
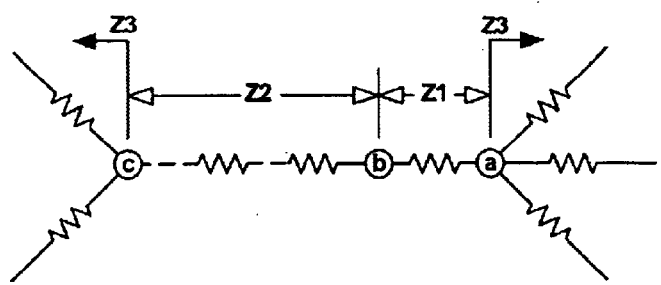
FIG. 15 represents a part of a battery system and demonstrates general rules to be followed when choosing electrical contact points.

The general rules to be followed in choosing electrical contact points can be understood with reference to FIG. 15. Contact points a and b must "bound" the subject element whose impedance Z1 is desired to be measured. Furthermore, at least one of those two points must have no more than one conducting path proceeding from it. That single-path point is chosen as contact point b. Contact point c can then be any point along this single conducting path that can be reached without encountering an intervening branching path. There can be additional paths branching from point c itself; as there can also be from point a. These two possibilities are illustrated in FIG. 12. However no paths can branch from point b or from any intermediate junction point between b and c.

If only the value of Z1 is desired, the number of cells/batteries and conductors disposed between contact point b and contact point c is unrestricted. However, as a result of the "no-branch" rule, an element on the end of a series string in a multi-string parallel array must have its point c on the side of the element that is farthest from the parallel connection. An interior element of a series string, however, can have its contact point c on either side.

An extension of this three-point measurement technique can be used to "de-embed" elements of parallel strings of batteries—such as are frequently employed in trucks and heavy equipment.

Figure 16A:
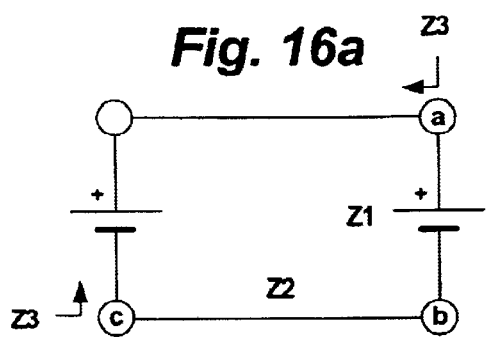
FIG. 16a is a schematic representation of two cells/batteries connected in parallel and depicts the determination of a first cell/battery impedance and a first interconnecting conductor impedance in accordance with a particular aspect of the present invention.
Figure 16B:
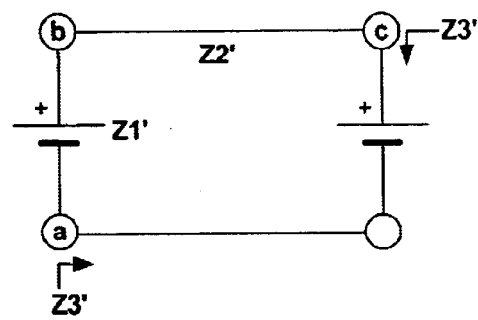
FIG. 16b is a schematic representation of two cells/batteries connected in parallel and depicts the determination of a second cell/battery impedance and a second interconnecting conductor impedance in accordance with a particular aspect of the present invention.

First, consider a simple system of two cells/batteries connected in parallel. FIG. 16a depicts such a system and identifies a choice of electrical contact points that simultaneously "de-embeds" the cell/battery on the right of FIG. 16a and the interconnecting conductor on the bottom. With the experimental arrangement shown, impedances Z1 and Z2 are given by equations (5) and (6), respectively. FIG. 16b shows a choice of electrical contact points that simultaneously "de-embeds" the other two elements. With the experimental arrangement shown in FIG. 16b, impedances Z1' and Z2' are given by equations (5) and (6), respectively. Thus, all four elements of this simple parallel system can be "de-embedded" with two sets of three-point measurements.

Parallel strings of cells/batteries present a special challenge. Both terminals of a cell/battery in the interior of a parallel string have more than one conducting path leading from them. Accordingly, neither terminal satisfies the "no-branch rule" that must be satisfied by a contacting point b. However, the standard three-point measurement technique can still be applied to the interconnecting conductors and to the two cell/batteries on the ends of the string; and an extended form of the technique, a four-point, five-measurement, technique, can be applied to the cells/batteries in the interior.

Figure 17A:
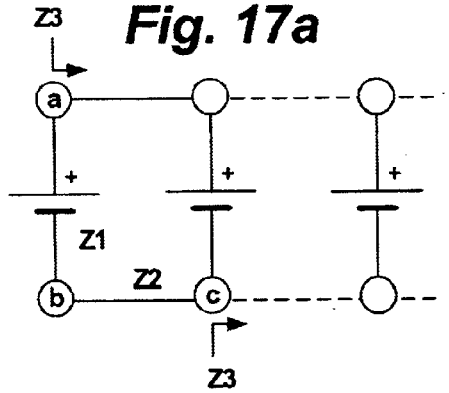
FIG. 17a is a schematic representation of a parallel string of multiple cells/batteries and depicts the determination of the impedances of a cell/battery and interconnecting conductor on a first end of the string in accordance with a particular aspect of the present invention.
Figure 17B:
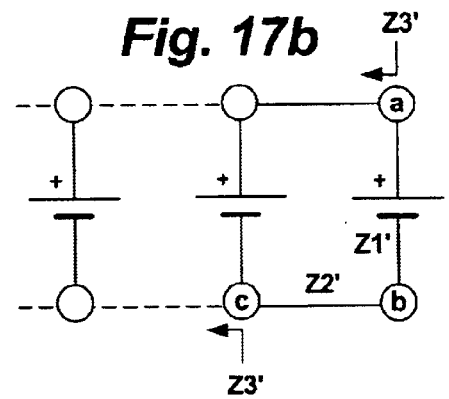
FIG. 17b is a schematic representation of a parallel string of multiple cells/batteries and depicts the determination of the impedances of a cell/battery and interconnecting conductor on a second end of the string in accordance with a particular aspect of the present invention.

First consider FIGS. 17a and 17b. These figures identify three electrical contact points used to "de-embed" the cells/batteries and interconnecting conductors on the ends of a multi-element parallel string. With the experimental arrangements shown, cell/battery impedances Z1 and Z1' are given by equation (5) and interconnecting conductor impedances Z2 and Z2' are given by equation (6). By simply re-arranging contact points, the impedances of the other two interconnecting conductors at the ends of this string can be similarly determined.

Figure 18A:
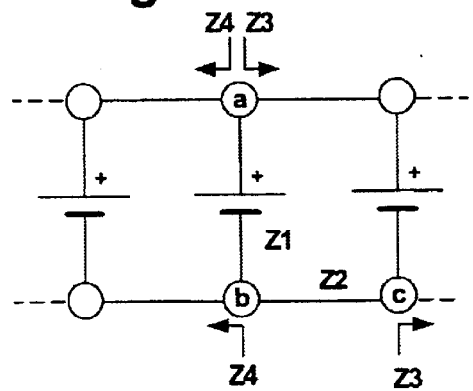
FIG. 18a is a schematic representation of a parallel string of multiple cells/batteries and depicts conditions of a first set of three-point measurements used in the determination of the impedances of an interior cell/battery and interconnecting conductor in accordance with a particular aspect of the present invention.
Figure 18B:
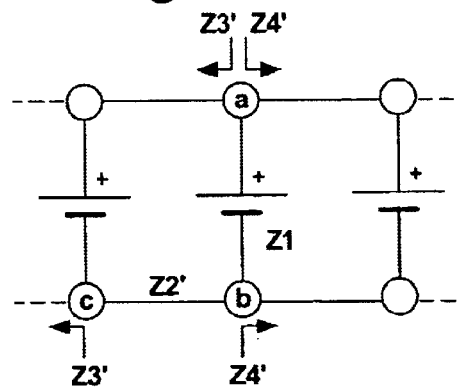
FIG. 18b is a schematic representation of a parallel string of multiple cells/batteries and depicts conditions of a second set of three-point measurements used in the determination of the impedances of an interior cell/battery and interconnecting conductor in accordance with a particular aspect of the present invention.

Now consider FIGS. 18a and 18b. These figures depict two experimental three-point measurement sets performed on a cell/battery and its interconnecting conductors disposed in the interior of a parallel string. Note that contact point c shifts from one side of the subject cell/battery to the other in the two experiments. However, Zab, the impedance measured between points a and b is the same in the two experiments. Thus, only five measurements are required to perform the two experiments.

Equation (6) unambiguously yields the interconnecting conductor impedances Z2 and Z2' in the two experiments. However, because contact point b does not satisfy the "no-branch rule", equation (5) does not yield Z1 directly in either experiment. Instead, equation (5) yields Z1 in parallel with Z4 in the first experiment and yields Z1 in parallel with Z4' in the second experiment. However, Z4=Z2'+Z3' is known from equations (6) and (7) of the second experiment, and Z4'=Z2+Z3 is known from equations (6) and (7) of the first experiment. Accordingly, by combining results of the two experiments, one can write the subject unknown cell/battery impedance Z1 as either $$Z1 = \frac{M1 \cdot (Z2' + Z3')}{(Z2' + Z3') - M1} \quad (8)$$

or $$Z1 = \frac{M1' \cdot (Z2 + Z3)}{(Z2 + Z3) - M1'} \quad (9)$$

where M1, Z2, and Z3 are the results of evaluating equations (5), (6), and (7), respectively, in the first experiment, and M1', Z2', and Z3' are the results of evaluating equations (5), (6), and (7), respectively, in the second experiment.

A special four-point impedance meter similar to three-point impedance meter 100 disclosed in FIG. 12, but having four system-contacting probes, could advantageously perform this four-point, five-measurement, procedure and "de-embed" any interior cell/battery in a parallel string without operator intervention.

For purposes of clarity, the above discussions have only considered complex impedance Z. However, it will be apparent to workers skilled in the art that the disclosed techniques apply equally well to measuring the reciprocal of complex impedance, complex admittance Y. Equations comparable to equation (5), (6), and (7) that give the unknown admittances Y1, Y2, and Y3 in terms of measured admittances Yab, Ybc, and Yac can be written $$Y1 = \frac{2YabYbcYca(YbcYca - YabYbc - YcaYab)}{Yab^2Ybc^2 + Ybc^2Yca^2 + Yca^2Yab^2 - 2(Yab^2YbcYca + YabYbc^2Yca + YabYbcYca^2)} \quad (10)$$

$$Y2 = \frac{2YabYbcYca(YcaYab - YbcYca - YabYbc)}{Yab^2Ybc^2 + Ybc^2Yca^2 + Yca^2Yab^2 - 2(Yab^2YbcYca + YabYbc^2Yca + YabYbcYca^2)} \quad (11)$$

and $$Y3 = \frac{2YabYbcYca(YabYbc - YcaYab - YbcYca)}{Yab^2Ybc^2 + Ybc^2Yca^2 + Yca^2Yab^2 - 2(Yab^2YbcYca + YabYbc^2Yca + YabYbcYca^2)} \quad (12)$$

Furthermore, if reactive and susceptive effects can be ignored, the disclosed techniques can likewise be applied to measuring real dynamic resistance R and real dynamic conductance G. Equations comparable to equation (5), (6), and (7) that give unknown dynamic resistances R1, R2, and R3 in terms of measured dynamic resistances Rab, Rbc, and Rca are $$R1 = \frac{(Rab^2 + Rbc^2 + Rca^2 - 2 \cdot Rbc \cdot Rca - 2 \cdot Rca \cdot Rab - 2 \cdot Rab \cdot Rbc)}{2 \cdot (Rab - Rbc - Rca)} \quad (13)$$

$$R2 = \frac{(Rab^2 + Rbc^2 + Rca^2 - 2 \cdot Rbc \cdot Rca - 2 \cdot Rca \cdot Rab - 2 \cdot Rab \cdot Rbc)}{2 \cdot (Rbc - Rca - Rab)} \quad (14)$$

and $$R3 = \frac{(Rab^2 + Rbc^2 + Rca^2 - 2 \cdot Rbc \cdot Rca - 2 \cdot Rca \cdot Rab - 2 \cdot Rab \cdot Rbc)}{2 \cdot (Rca - Rab - Rbc)} \quad (15)$$

Similarly, equations comparable to equations (5), (6), and (7) that give unknown dynamic conductances G1, G2, and G3 in terms of measured dynamic conductances, Gab, Gbc and Gca are $$G1 = \frac{2GabGbcGca(GbcGca - GabGbc - GcaGab)}{Gab^2Gbc^2 + Gbc^2Gca^2 + Gca^2Gab^2 - 2(Gab^2GbcGca + GabGbc^2Gca + GabGbcGca^2)} \quad (16)$$

$$G2 = \frac{2GabGbcGca(GcaGab - GbcGca - GabGbc)}{Gab^2Gbc^2 + Gbc^2Gca^2 + Gca^2Gab^2 - 2(Gab^2GbcGca + GabGbc^2Gca + GabGbcGca^2)} \quad (17)$$

and $$G3 = \frac{2GabGbcGca(GabGbc - GcaGab - GbcGca)}{Gab^2Gbc^2 + Gbc^2Gca^2 + Gca^2Gab^2 - 2(Gab^2GbcGca + GabGbc^2Gca + GabGbcGca^2)} \quad (18)$$

Since all four quantities, Z, Y, R, and G are measured with time-varying signals, they are referred to collectively as "dynamic parameters".

Although the present invention has been described with reference to preferred embodiments, workers skilled in the art will recognize that changes can be made in form and detail without departing from the true spirit and scope of the invention. For example, single conductor probes rather than Kelvin probes could be employed if element impedances are sufficiently large. The required measurements could be simply performed using conventional measuring apparatus, results written down after each measurement and a hand calculator or computer subsequently employed to evaluate the appropriate equations. Alternatively, the measuring apparatus could itself contain onboard memory circuitry to store the measurements and onboard computation circuitry to perform the "de-embedding" calculations. Furthermore, the system-contacting probes could be multiplexed or switched, thus permitting the measuring apparatus to couple to the system at all of the desired contact points simultaneously. Although specific "de-embedding" examples employing three and five measurements have been disclosed, any number of measurements could actually be employed. The measurement steps could occur in any order or occur substantially simultaneously. "De-embedding" could be implemented with hand-held equipment carried to a site. It could also be implemented with permanently integrated measuring apparatus distributed throughout the entire system and adapted to automatically "de-embed" and monitor various elements of the system. These and other variations are believed to be well within the scope of the present invention and are intended to be covered by the appended claims.

What is claimed is:

1. Apparatus for evaluating a dynamic parameter of an element embedded in a system of interconnected electrochemical cells or batteries, said element bounded by first and second electrical contact points, comprising:
   dynamic parameter measuring circuitry simultaneously coupled to said first and second contact points and rendering a first dynamic parameter measurement, simultaneously coupled to said second contact point and to a third electrical contact point displaced on a conducting path from said second contact point and rendering a second dynamic parameter measurement, and simultaneously coupled to said third contact point and to said first contact point and rendering a third dynamic parameter measurement, and;
   computation circuitry adapted to compute said dynamic parameter of said element from said first, second, and third dynamic parameter measurements.

2. Apparatus as in claim 1 wherein said computation circuitry comprises a hand calculator or computer.

3. Apparatus as in claim 1 wherein said computation circuitry comprises onboard computation circuitry.

4. Apparatus as in claim 3 including onboard memory circuitry adapted to store said first, second, and third dynamic parameter measurements, for processing by said onboard computation circuitry.

5. Apparatus as in claim 1 wherein said dynamic parameter measuring circuitry includes input multiplexing circuitry simultaneously coupled to said first, second, and third electrical contact points.

6. Apparatus as in claim 1 wherein said dynamic parameter measuring circuitry couples to said first, second, and third electrical contact points with Kelvin probes.

7. Apparatus as in claim 1 wherein said dynamic parameter is complex impedance.

8. Apparatus as in claim 1 wherein said dynamic parameter is complex admittance.

9. Apparatus as in claim 1 wherein said dynamic parameter is dynamic resistance.

10. Apparatus as in claim 1 wherein said dynamic parameter is dynamic conductance.

11. Apparatus as in claim 1 wherein said element is an electrochemical cell.

12. Apparatus as in claim 1 wherein said element is an electrochemical battery.

13. Apparatus as in claim 1 where said element is an electrical conductor.

14. A method for evaluating a dynamic parameter of an element embedded in a system of interconnected electrochemical cells or batteries, said element bounded by first and second electrical contact points, comprising:
obtaining a first dynamic parameter value existent between
said first and second electrical contact points; obtaining a second dynamic parameter value existent between said second electrical contact point and a third electrical contact point in said system; obtaining a third dynamic parameter value existent between said third electrical contact point and said first electrical contact point; and, computing said dynamic parameter of said element from said
first, second, and third dynamic parameter values.

15. A method as in claim 14 wherein said first, second, and third dynamic parameter values are obtained by measurement.

16. A method as in claim 14 wherein said dynamic parameter is complex impedance.

17. A method as in claim 14 wherein said dynamic parameter is complex admittance.

18. A method as in claim 14 wherein said dynamic parameter is dynamic resistance.

19. A method as in claim 14 wherein said dynamic parameter is dynamic conductance.

20. A method as in claim 14 wherein said element is an electrochemical cell.

21. A method as in claim 14 wherein said element is an electrochemical battery.

22. A method as in claim 14 wherein said element is an electrical conductor.

23. A method as in claim 15 wherein said measurement employs Kelvin probes.

24. A method for evaluating a dynamic parameter of an electrochemical cell or battery embedded internally in an array of parallel-connected electrochemical cells or batteries comprising:
obtaining a first dynamic parameter value existent between first and second contact points comprising terminals of said electrochemical cell or battery;
obtaining a second dynamic parameter value existent between said second contact point and a third contact point disposed on a first conducting path proceeding from said second contact point;
obtaining a third dynamic parameter value existent between said second contact point and a fourth contact point disposed on a second conducting path proceeding from said second contact point;
obtaining a fourth dynamic parameter value existent between said third contact point and said first contact point;
obtaining a fifth dynamic parameter value existent between said fourth contact point and said first contact point; and,
computing said dynamic parameter of said electrochemical cell or battery from said first, second, third, fourth, and fifth dynamic parameter values.

25. A method as in claim 24 wherein said first, second, third, fourth, and fifth dynamic parameter values are obtained by measurement.

26. A method as in claim 24 wherein said dynamic parameter is complex impedance.

27. A method as in claim 24 wherein said dynamic parameter is complex admittance.

28. A method as in claim 24 wherein said dynamic parameter is dynamic resistance.

29. A method as in claim 24 wherein said dynamic parameter is dynamic conductance.

30. A method as in claim 25 wherein said measurement employs Kelvin probes.

31. A method for evaluating a dynamic parameter of an interconnecting conductor embedded internally in an array of parallel-connected electrochemical cells or batteries comprising:
obtaining a first dynamic parameter value existent between first and second contact points bounding said interconnecting conductor, said second contact point comprising a first terminal of a cell or battery;
obtaining a second dynamic parameter value existent between said second contact point and a third contact point comprising a second terminal of said cell or battery;
obtaining a third dynamic parameter value existent between said first and third contact points; and,
computing said dynamic parameter of said interconnecting conductor from said first, second, and third dynamic parameter values.

32. A method as in claim 31 wherein said first, second, and third dynamic parameter values are obtained by measurement.

33. A method as in claim 31 wherein said dynamic parameter is complex impedance.

34. A method as in claim 31 wherein said dynamic parameter is complex admittance.

35. A method as in claim 31 wherein said dynamic parameter is dynamic resistance.

36. A method as in claim 31 wherein said dynamic parameter is dynamic conductance.

37. A method as in claim 32 wherein said measurement employs Kelvin probes.

38. Apparatus for evaluating dynamic parameters of first and second adjacent electrical elements having a common connecting point and embedded in a system of interconnected electrochemical cells or batteries comprising:
dynamic parameter measuring circuitry simultaneously coupled to said first element at a first contact point and said common connecting point and rendering a first dynamic parameter measurement, simultaneously coupled to said second element at a second contact point and said common connecting point and rendering a second dynamic parameter measurement, and simultaneously coupled to said first and second contact points and rendering a third dynamic parameter measurement;
computation circuitry adapted to compute said dynamic parameters of said first and second adjacent electrical elements from said first, second, and third dynamic parameter measurements.

39. Apparatus as in claim 38 wherein said computation circuitry comprises a hand calculator or computer.

40. Apparatus as in claim 38 wherein said computation circuitry comprises onboard computation circuitry.

41. Apparatus as in claim 40 including onboard memory circuitry adapted to store said first, second, and third dynamic parameter measurements for processing by said onboard computation circuitry.

42. Apparatus as in claim 38 wherein said dynamic parameter measuring circuitry includes input multiplexing circuitry simultaneously coupled to said first and second contact points and said common connecting point.

43. Apparatus as in claim 38 wherein said dynamic parameter measuring circuitry couples to said first and second contact points and to said common connecting point with Kelvin probes.

44. Apparatus as in claim 38 wherein said dynamic parameter is complex impedance.

45. Apparatus as in claim 38 wherein said dynamic parameter is complex admittance.

46. Apparatus as in claim 38 wherein said dynamic parameter is dynamic resistance.

47. Apparatus as in claim 38 wherein said dynamic parameter is dynamic conductance.

48. Apparatus as in claim 38 wherein said first and second adjacent electrical elements comprise an electrochemical cell and an interconnecting electrical conductor.

49. Apparatus as in claim 38 wherein said first and second adjacent electrical elements comprise an electrochemical battery and an interconnecting electrical conductor.

50. A method for evaluating dynamic parameters of first and second adjacent electrical elements having a common connecting point and embedded in a system of interconnected electrochemical cells or batteries comprising:

obtaining a first dynamic parameter value existent between said common connecting point and a first contact point bounding said first electrical element;

obtaining a second dynamic parameter value existent between said common connecting point and a second contact point bounding said second electrical element;

obtaining a third dynamic parameter value existent between said first and second contact points; and, computing said dynamic parameters of said first and second adjacent electrical elements from said first, second, and third dynamic parameter values.

51. A method as in claim 50 wherein said first, second, and third dynamic parameter values are obtained by measurement.

52. A method as in claim 51 wherein said measurement employs Kelvin probes.

53. A method as in claim 50 wherein said dynamic parameter is complex impedance.

54. A method as in claim 50 wherein said dynamic parameter is complex admittance.

55. A method as in claim 50 wherein said dynamic parameter is dynamic resistance.

56. A method as in claim 50 wherein said dynamic parameter is dynamic conductance.

57. A method as in claim 50 wherein said first and second adjacent electrical elements comprise an electrochemical cell and an electrical conductor.

58. A method as in claim 50 wherein said first and second adjacent electrical elements comprise an electrochemical battery and an electrical conductor.

59. Apparatus for de-embedding electrical elements embedded in a system of electrochemical cells/batteries and conductors interconnected at a plurality of interconnection points comprising:

dynamic parameter measuring circuitry including two input probes, said measuring circuitry adapted to measure a dynamic parameter of an isolated electrical element coupled between said input probes;

at least three system-contacting probes adapted to simultaneously couple to elements of said system at three or more electrical contact points;

switching circuitry interposed between said input probes and said system-contacting probes and adapted to controllably couple said input probes to selected pairs of said system-contacting probes;

control circuitry adapted to command said switching circuitry to consecutively couple different pairs of said system-contacting probes to said input probes and to command said dynamic parameter measuring circuitry to measure a dynamic parameter value during each said coupling;

memory circuitry adapted to store each said measured dynamic parameter value; and, computation circuitry adapted to compute one or more dynamic parameters of said electrical elements from said measured dynamic parameter values stored in said memory circuitry.

60. Apparatus as in claim 59 wherein said input probes comprise Kelvin input probes and said system-contacting probes comprise Kelvin system-contacting probes.

61. Apparatus as in claim 59 wherein said dynamic parameter is complex impedance.

62. Apparatus as in claim 59 wherein said dynamic parameter is complex admittance.

63. Apparatus as in claim 59 wherein said dynamic parameter is dynamic resistance.

64. Apparatus as in claim 59 wherein said dynamic parameter is dynamic conductance.

65. Apparatus as in claim 59 wherein said electrical elements include one or more electrochemical cells.

66. Apparatus as in claim 59 wherein said electrical elements include one or more electrochemical batteries.

67. Apparatus as in claim 59 wherein said electrical elements include one or more electrical conductors.

68. Apparatus as in claim 59 wherein said computation circuitry computes a dynamic parameter from three said measured dynamic parameter values.

69. Apparatus as in claim 59 wherein said computation circuitry computes a dynamic parameter from five said measured dynamic parameter values.

70. Apparatus as in claim 59 wherein said control circuitry and said computation circuitry comprise microprocessor or microcontroller circuitry.

* * * * *